US012745569B2

(12) United States Patent
Xu et al.

(10) Patent No.: US 12,745,569 B2
(45) Date of Patent: Sep. 22, 2026

(54) MAGNETIC TUNNEL JUNCTION STACK AND METHOD FOR MANUFACTURING THE SAME

(71) Applicant: TAIWAN SEMICONDUCTOR MANUFACTURING COMPANY, LTD., Hsinchu (TW)

(72) Inventors: Nuo Xu, Hsinchu (TW); Po-Sheng Lu, Hsinchu (TW); Zhi-Ren Xiao, Hsinchu (TW); Zhiqiang Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 658 days.

(21) Appl. No.: 17/734,535

(22) Filed: May 2, 2022

(65) Prior Publication Data

US 2023/0354718 A1 Nov. 2, 2023

(51) Int. Cl.

*H10N 50/80* (2023.01)
*H10B 61/00* (2023.01)
*H10N 50/01* (2023.01)
*H10N 50/85* (2023.01)

(52) U.S. Cl.

CPC ............. *H10N 50/80* (2023.02); *H10B 61/00* (2023.02); *H10N 50/01* (2023.02); *H10N 50/85* (2023.02)

(58) Field of Classification Search

CPC ........ H10N 50/85; H10N 50/01; H10N 50/80; H10N 50/10; H10B 61/00

See application file for complete search history.

(56) References Cited

U.S. PATENT DOCUMENTS

2007/0159734 A1* 7/2007 Nguyen ................. H10N 50/85 360/324.1
2011/0133298 A1* 6/2011 Chen ...................... H10N 50/01 257/E43.001
2016/0293836 A1* 10/2016 Lim ........................ H10N 50/01
2020/0106001 A1* 4/2020 Gupta .................... H10N 50/85
2020/0403143 A1* 12/2020 Iwata ..................... H10N 50/01
2021/0159392 A1* 5/2021 Prasad .................... H01F 41/32

OTHER PUBLICATIONS

Stergar, The Synthesis and Characterization of Copper-Nickel Alloy Nanoparticles with a Therapeutic Curie Point using the Microemulsion Method, 2013 (Year: 2013).*

Chen, Underlayer Effect on Perpendicular Magnetic Anisotropy in Co20Fe60B20\MgO Films, 2016 (Year: 2016).*

Crangle, The Magnetization of Ferromagnetic Binary Alloys of Cobalt or Nickel with Elements of Palladium and Platinum Groups, 1960 (Year: 1960).*

Bruno, (Theory of the Curie Temperature of Cobalt-Based Ferromagnetic Ultrathin Films and Multilayers, 1991 (Year: 1991).*

* cited by examiner

*Primary Examiner* — Britt Hanley
*Assistant Examiner* — Casey Paul Boatman
(74) *Attorney, Agent, or Firm* — Birch, Stewart, Kolasch & Birch, LLP

(57) ABSTRACT

A magnetic tunnel junction (MTJ) stack includes a reference layer, a tunnel barrier layer, a free layer, and a superparamagnetic layer. The reference layer has a fixed magnetization direction. The tunnel barrier layer is disposed on the reference layer, and includes an insulating material. The free layer has a changeable magnetization direction, and is disposed on the tunnel barrier layer opposite to the reference layer. The superparamagnetic layer is disposed on the free layer opposite to the tunnel barrier layer. Methods for manufacturing the MTJ stack are also disclosed.

20 Claims, 13 Drawing Sheets

1
Upper Electrode
4
Capping Layer
38
Reference Layer
33
Tunnel Barrier Layer
34
3
Free layer
35
SPL
36
Spacer Layer
39
Seed Layer
32
Buffer Layer
31
Substrate
2
Z
X
Y

MAGNETIC TUNNEL JUNCTION STACK AND METHOD FOR MANUFACTURING THE SAME

BACKGROUND

Magnetic tunnel junction (MTJ) is a core component in several applications including read-heads of hard disk drives, sensors and magneto-resistive random-access memory (MRAM). Among them, MRAM is an emerging non-volatile memory that is advantageous in terms of ultra-low power consumption and easy integration with logic circuits, and is competitive with memories that are widely used in main memories (e.g., dynamic random-access memory, DRAM) and storage memories (e.g., solid-state disk, SSD). However, for high-throughput memory applications (e.g., cache-like memory, static random-access memory, SRAM), existing MRAM technology still has the potential to be continuously developed to achieve a higher write speed and a lower write current with an acceptable bit error rate (BER).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
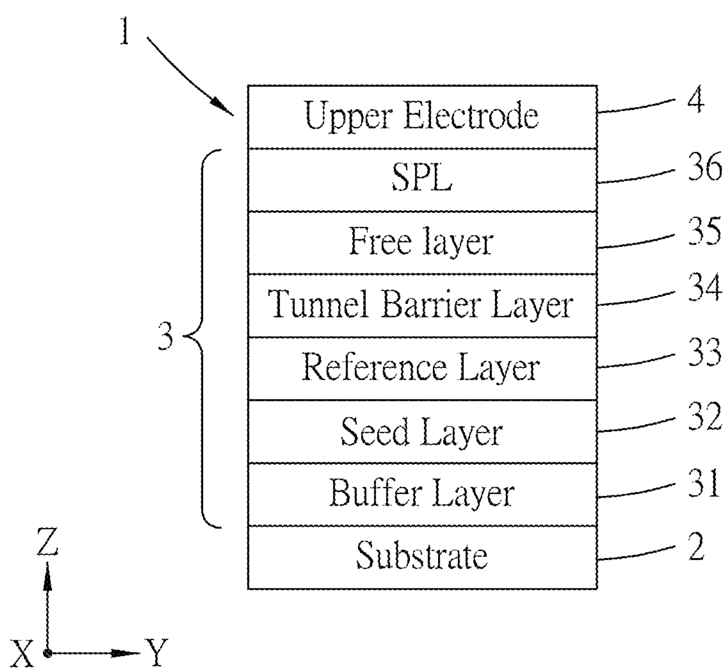
FIG. 1 illustrates a sectional schematic view of a magnetic device in a bottom spin valve configuration in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “on,” “above,” “top,” “bottom,” “upper,” “lower,” “over,” “beneath,” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a magnetic tunnel junction (MTJ) stack with improved energy efficiency and a method for manufacturing the same. The MTJ stack may be incorporated in various magnetic devices, such as magneto-resistive random-access memory (MRAM), sensors, biosensors, spin-transfer torque MRAM (STT-MRAM), spin-orbit torque MRAM (SOT-MRAM), voltage-controlled magnetic anisotropy MRAM (VCMA-MRAM, VC-MRAM), spintronic devices (e.g., spin-torque oscillator (STO) or microwave-assisted magnetic recording (MAMR)), or various designs of perpendicular magnetic anisotropic (PMA) spin valves, but are not limited thereto. Other suitable applications for the MTJ stack are within the contemplated scope of the present disclosure. Furthermore, the dimension of the MTJ stack is able to be adjusted, so that the MTJ stack is permitted to be integrated in various varieties of semiconductor technology nodes or generations.

FIG. 1 illustrates a sectional schematic view of an example of a magnetic device 1 in a bottom spin valve configuration in accordance with some embodiments. The magnetic device 1 includes a substrate 2, an upper electrode 4, and a magnetic tunnel junction (MTJ) stack 3 interposed between the substrate 2 and the upper electrode 4. The MTJ stack 3 is switchable between a parallel (P) state (i.e., a relatively low resistance state) and an antiparallel (AP) state (i.e., a relatively high resistance state) so as to store, for example, but not limited to, binary data (e.g., "0" or "1"). The MTJ stack 3 includes a reference layer 33 disposed on the substrate 2, a tunnel barrier layer 34 disposed on the reference layer 33, a free layer 35 disposed on the tunnel barrier layer 34 opposite to the reference layer 33, and a superparamagnetic layer (SPL) 36 disposed on the free layer 35 opposite to the tunnel barrier layer 34. The reference layer 33 has a fixed magnetization direction, and the free layer 35 has a changeable magnetization direction (e.g., parallel or antiparallel to the magnetization direction of the reference layer 33) so that the MTJ stack 3 is in the P state or the AP state. The SPL 36 is provided for reducing switching energy of the MTJ stack 3 to switch between the P state and the AP state. In some embodiments, the substrate 2 may include a lower electrode (which is also denoted by the numeral 2). The upper electrode 4 and the lower electrode 2 of the magnetic device 1 includes non-magnetic conductive material, and are electrically coupled to two sequential ones of metal interconnecting layers (not shown), so that the magnetic device 1 can be controlled by a peripheral circuit (for example, but not limited to, a bit line, a source line, or a word line) or other suitable devices.

The tunnel barrier layer 34 includes a first insulating material and is thin enough so as to permit electrons to tunnel therethrough when a bias voltage is applied between the lower electrode 2 and the upper electrode 4. In some embodiments, the first insulating material of the tunnel barrier layer 34 includes an oxide, a nitride, an oxynitride, or combinations thereof, so as to induce a spin dependent tunneling effect between the reference layer 33 and the free layer 35. In some embodiments, the first insulating material of the tunnel barrier layer 34 includes, for example, but is not limited to, magnesium oxide ($MgO_x$), aluminum oxide ($AlO_x$), silicon oxide ($SiO_x$), titanium oxide ($TiO_x$), tantalum oxide ($TaO_x$), chromium oxide ($CrO_x$), hafnium oxide ($HfO_x$), zinc oxide ($ZnO_x$), zirconia oxide ($ZrO_x$), aluminum nitride (AlN), aluminum oxynitride (AlON), magnesium aluminum oxide (MgAlOX), magnesium silicon oxide ($MgSiO_x$), magnesium titanium oxide ($MgTiO_x$), magnesium tantalum oxide ($MgTaO_x$), magnesium hafnium oxide ($MgHfO_x$), magnesium zirconia oxide ($MgZrO_x$), or combinations thereof. Other suitable materials for the tunnel barrier layer 34 are within the contemplated scope of the present disclosure. In some embodiments, the tunnel barrier layer 34 has a thickness ranging from about 5 Å to about 15 Å.

In some embodiments, the reference layer 33 includes a first magnetic material, such as cobalt (Co), iron (Fe), nickel (Ni), cobalt-iron alloy (CoFe), cobalt-iron-nickel alloy (CoFeNi), cobalt-boron alloy (CoB), iron-boron alloy (FeB), cobalt-iron-boron alloy (CoFeB), or combinations thereof. In some embodiments, the reference layer 33 may be formed as a single layer structure or a multi-layered structure, such as $(Co/X)_n$, where X may be nickel (Ni), platinum (Pt), palladium (Pd), etc., and n is an integer greater than two. In some embodiments, the reference layer 33 exhibits perpendicular magnetic anisotropy (PMA) with a fixed magnetization direction perpendicular to the plane of the substrate 2. In some embodiments, the reference layer 33 further includes a non-magnetic coupling layer (not shown), such as ruthenium (Ru) or iridium (Ir), which is stacked with the magnetic material and which serves as a moment diluting layer. In some embodiments, the reference layer 33 further includes a transition layer (not shown) which is in contact with the tunnel barrier layer 34 so as to induce or enhance interfacial PMA of the reference layer 33 by forming, for example, but not limited to, a magnetic metal/oxide interface. Other suitable materials for the reference layer 33 are within the contemplated scope of the present disclosure. In some embodiments, the reference layer 33 has a thickness ranging from about 20 Å to about 100 Å.

In some embodiments, the free layer 35 includes a second magnetic material, such as Fe, Co, Ni, CoFe, CoFeNi, CoB, FeB, CoFeB, cobalt-iron-nickel-boron alloy (CoFeNiB), or combinations thereof. In some embodiments, the free layer 35 may be formed as a single layer structure or a multi-layered structure having alternatively stacked magnetic and non-magnetic sub-layers. In some embodiments, the free layer 35 has a thickness ranging from about 5 Å to about 20 Å. In some embodiments, the tunnel barrier layer 34 and the free layer 35 together induce an interfacial PMA by forming electronic bonds between the second magnetic material (e.g., CoFeB) and the first insulating material (e.g., MgO). For example, through inducing the formation of an iron-oxygen (Fe—O) bond (i.e., a bonding between an iron ion in the free layer 35 and an oxygen ion in the tunnel barrier layer 34), the free layer 35 exhibits perpendicular magnetic anisotropy (PMA) in a direction parallel or antiparallel to the magnetization direction of the reference layer 33 in the absence of an external magnetic field.

In some embodiments, the SPL 36 includes an alloy of a third magnetic material and a non-magnetic material. In some embodiments, the third magnetic material includes cobalt (Co), iron (Fe), nickel (Ni), or alloys thereof. The non-magnetic material of the SPL 36 includes a non-magnetic element which is in a solid form at room temperature. In some embodiments, the non-magnetic material of the SPL 36 includes tungsten (W), silicon (Si), tantalum (Ta), titanium (Ti), molybdenum (Mo), ruthenium (Ru), iridium (Ir), aluminum (Al), copper (Cu), platinum (Pt), zirconium (Zr), zinc (Zn), lead (Pb), or combinations thereof. In some embodiments, the SPL 36 may include impurities (e.g., boron from the reference layer 33 or the free layer 35) which is diffused into the SPL 36 during annealing steps. In some embodiments, the alloy is represented by a general composition formula of $A_xB_{(1-x)}$, where A represents the non-magnetic material, B represents the third magnetic material, and x is a positive value ($0<x<1$). In some embodiments, the alloy suitable for forming the SPL 36 has a body-centered cubic (bcc) crystalline structure so as to exhibit superparamagnetic properties. In some embodiments, the alloy may be formed as a single crystalline structure or a polycrystalline structure. In some embodiments, the SPL 36 may be formed as a single layer structure or a multi-layered structure having a plurality of sub-layers. In some embodiments, the alloy in each of the sub-layers may have different compositions, i.e., the sub-layers respectively include the alloys with different x values, while in some other embodiments, the alloy in each of sub-layers may have the same composition, i.e., the sub-layers respectively include the alloys with the same x value. In some embodiments, the number of the sub-layers may range from about two to four.

Figure 2:
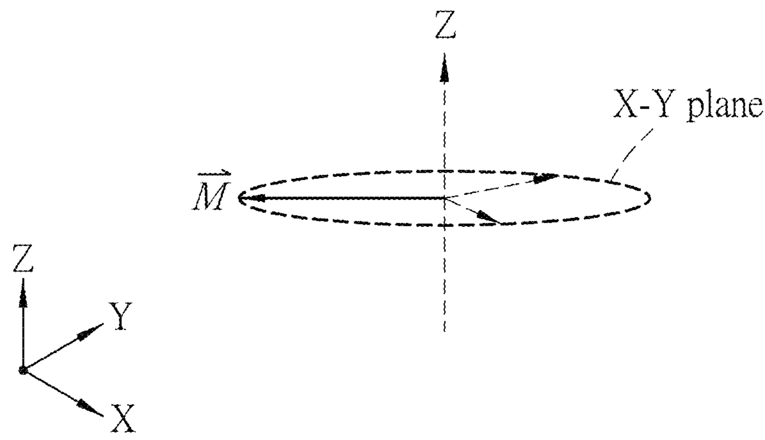
FIG. 2 is a three dimension schematic view illustrating a time-varying magnetization vector ($\vec{M}$) of a superparamagnetic layer (SPL) when the SPL is not coupled to any magnetic layers with perpendicular magnetic anisotropic (PMA) behavior in accordance with some embodiments.
Figure 3:
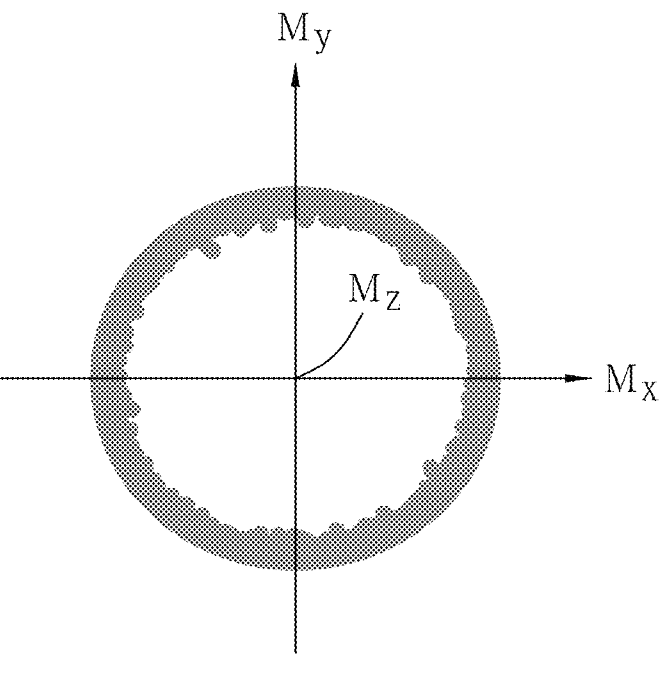
FIG. 3 is a scatter plot illustrating the time-varying magnetization vector ($\vec{M}$) of the SPL shown in FIG. 2 in an X-Y plane in accordance with some embodiments.
Figure 4:
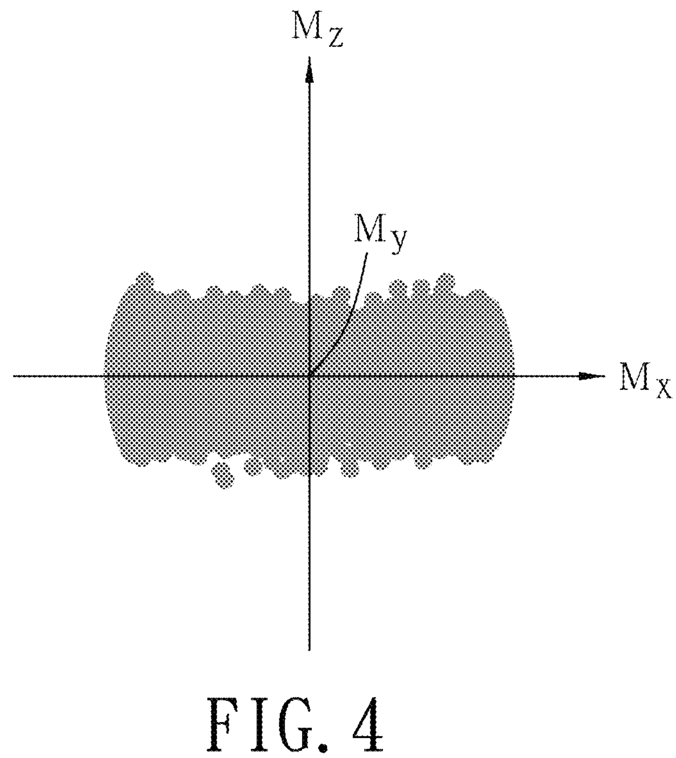
FIGS. 4 and 5 are scatter plots similar to that of FIG. 3 but illustrating the time-varying magnetization vector ($\vec{M}$) of the SPL shown in FIG. 2 respectively in an X-Z plane and a Y-Z plane in accordance with some embodiments.
Figure 5:
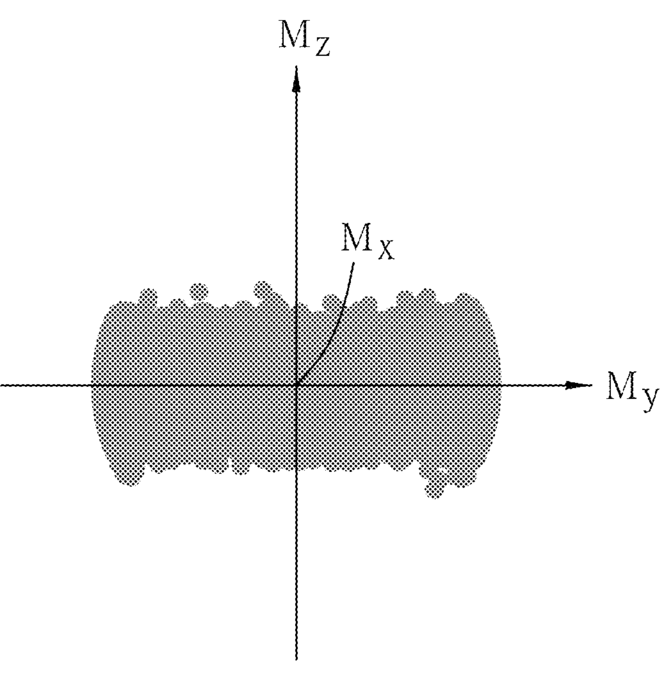

In some embodiments, the SPL 36 has an easy-plane magnetic anisotropy in the absence of an external field. FIG. 2 is a three dimension schematic view illustrating a time-varying magnetization vector ($\vec{M}$) of the SPL 36 when the SPL 36 is not coupled to any magnetic layers with PMA behavior. In FIG. 2, a precessional motion of a magnetization vector ($\vec{M}$) of the SPL 36, which has a constant magnitude, is shown as a dashed circle which lies in an X-Y plane that is normal to a Z direction. The magnetization vector ($\vec{M}$) of the SPL 36 has components Mx, My and Mz along three coordinate axes (i.e., the X, Y, and Z axes), respectively. FIG. 3 is a scatter plot illustrating the time-varying magnetization vector ($\vec{M}$) of the SPL 36 shown in FIG. 2 in the X-Y plane in accordance with some embodiments. FIGS. 4 and 5 are scatter plots similar to that of FIG. 3 but illustrating the time-varying magnetization vector ($\vec{M}$) of the SPL 36 shown in FIG. 2 respectively in an X-Z plane and a Y-Z plane in accordance with some embodiments. In FIGS. 3 to 5, each of the data points represents the magnetization vector ($\vec{M}$) of the SPL 36 at a certain time. It can be seen that in the absence of an external field, a magnetization direction, which is a direction of the magnetization vector ($\vec{M}$), randomly flips (or precesses) about the Z direction, and randomly deviates from the X-Y plane (i.e., up or down) with some probability due to thermal noise. A typical time between any two flips of the magnetization direction of the SPL 36 is called a Neel relaxation time. In the absence of the external magnetic field, the Neel relaxation time of the SPL 36 is much shorter than a time used to measure the magnetization direction of the SPL 36, so the magnetization direction of the SPL 36 during the measurement time appears to be about zero on average. The measurement of the magnetization vector ($\vec{M}$) of the SPL 36 may be performed by spin torque ferromagnetic resonance (ST-FMR). Therefore, the SPL 36 is referred to as being in a superparamagnetic state at room temperature. Furthermore, when a magnetization direction of the SPL 36 randomly flips (or precesses) about the Z direction, the SPL 36 is relatively stabilized (i.e., has a relatively lower energy) when the magnetization direction of SPL 36 has an angle (B) (for example, but not limited to, about 90 degree) with respect to the Z direction (see FIG. 6). In other words, the SPL 36 has an easy-plane of magnetization in the X-Y plane. Therefore, the SPL 36 can be referred to as an easy-plane superparamagnetic layer (ESPL). In some embodiments, the SPL 36 has a thickness ranging from about 2 Å to about 15 Å. If the thickness of the SPL 36 is smaller than about 2 Å, the magnetic properties of the SPL 36 may transform from superparamagnetic to non-magnetic (e.g., paramagnetic). If the thickness of the SPL 36 is greater than about 15 Å, the magnetic properties of the SPL 36 may transform from superparamagnetic to ferromagnetic. In some other embodiments, the SPL 36 may have an easy-plane of magnetization other than the X-Y plane.

Figure 6:
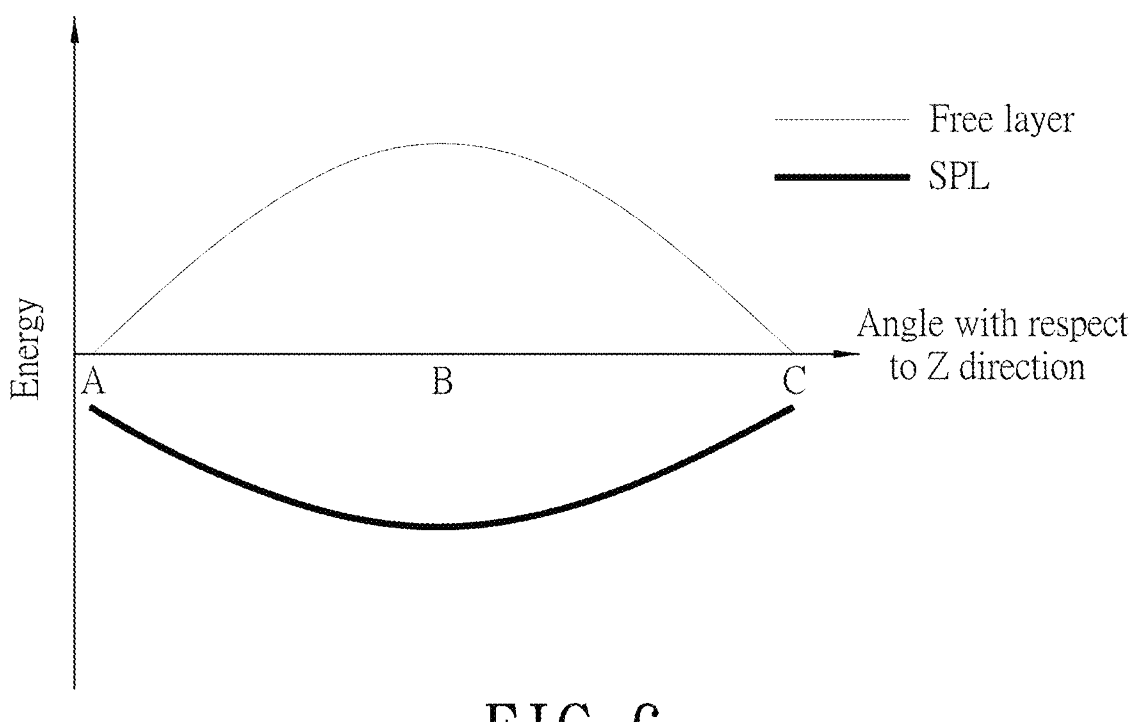
FIG. 6 is a graph illustrating a relationship of energy and magnetization angle with respect to a Z direction for a free layer and the SPL in accordance with some embodiments.

FIG. 6 is a graph illustrating a relationship of energy and magnetization angle with respect to the Z direction for the free layer 35 and the SPL 36 in accordance with some embodiments. It can be seen that the free layer 35 is relatively stabilized (i.e., has a relatively lower energy) when the free layer 35 has a magnetization direction having an angle (A) (for example, about 0 degree) with respect to the Z direction (i.e., upward magnetization direction) or when the free layer 35 has a magnetization direction having an angle (C) (for example, about 180 degree) with respect to the Z direction (i.e., downward magnetization direction). In some embodiments, the free layer 35 has an easy-axis of magnetization along the Z direction. Thus, for the free layer 35, to initiate a flip of a magnetization direction from upward to downward or from downward to upward is relatively difficult. In some embodiments, the SPL 36 has a magnetization direction different from that of the free layer 35. In some embodiments, the magnetization direction of the SPL 36 is substantially perpendicular to that of the free layer 35. When the SPL 36 is coupled to the free layer 35, the coupling between the SPL 36 and the free layer 35 may cause the magnetization direction of free layer 35 to tilt at an angle ($\alpha$) (see FIG. 10) relative to the easy-axis (e.g., the Z direction) thereof in the absence of an external field. Therefore, when an external magnetic field (or a write current) is applied to the MTJ stack 3, the free layer 35 is able to start flipping more easily. The easier the free layer 35 flips, the lower a switching current (i.e., write current) for flipping the free layer 35 needs to be. Therefore, with the introduction of the SPL 36, the MTJ stack 3 with a reduced switching current can be achieved.

Figure 7:
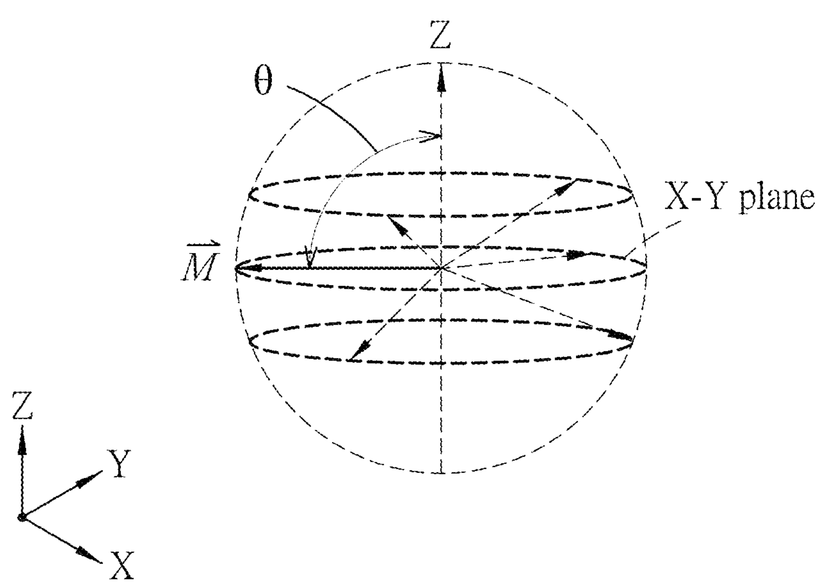
FIG. 7 is a view similar to that of FIG. 2 but illustrating a time-varying magnetization vector ($\vec{M}$) of the SPL when the SPL is coupled to a magnetic layer with PMA behavior in accordance with some embodiments.

FIG. 7 is a view similar to that of FIG. 2 but illustrating a time-varying magnetization vector ($\vec{M}$) of the SPL 36 when the SPL 36 is coupled to a magnetic layer with PMA behavior (e.g., the free layer 35) in accordance with some embodiments. In FIG. 7, a precessional motion of the magnetization vector ($\vec{M}$) of the SPL 36, which has a constant magnitude, is shown. It can be seen that when the SPL 36 is coupled to the free layer 35 having the upward magnetization direction, in the absence of an external field, the SPL 36 has a magnetization direction which randomly flips (or precesses) about the Z direction at an angle ($\theta$) in the X-Y plane or above it. On the contrary, when the SPL 36 is coupled to the free layer 35 having the downward magnetization direction, in the absence of an external field, the SPL 36 has a magnetization direction which randomly flips (or precesses) about the Z direction at an angle ($\theta$) in the X-Y plane or beneath it. The coupling between two adjacent magnetic layers (i.e., the SPL 36 and the free layer 35) may originate from interaction between atoms in the two adjacent magnetic layers. The coupling may be referred to as interlayer exchange coupling (IEC).

Referring again to FIG. 1, in some embodiments, the MTJ stack 3 further includes a buffer layer 31 and a seed layer 32. The buffer layer 31 is optional, but is often used for lattice matching between the substrate 2 and a layer (e.g., the seed layer 32) disposed thereon. The seed layer 32 is optional, but is often used to facilitate uniform crystal growth of a multi-layered stack formed thereon. In some embodiments, the buffer layer 31 includes titanium (Ti), tantalum (Ta), aluminum (Al), titanium nitride (TiN), tantalum nitride (TaN), zirconium (Zr), zirconium nitride (ZrN), hafnium (Hf), hafnium nitride (HfN), or combinations thereof. In some embodiments, the buffer layer 31 may be formed as a single layer structure or a multi-layered structure. Other suitable materials or configuration for the buffer layer 31 are within the contemplated scope of the present disclosure. In some embodiments, the buffer layer 31 has a thickness ranging from about 100 Å to about 500 Å. In some embodiments, the seed layer 32 includes nickel (Ni), ruthenium (Ru), platinum (Pt), tantalum (Ta), chromium (Cr), nitrides thereof, alloys thereof, or combinations thereof. In some embodiments, the seed layer 32 may be formed as a single layer structure or a multi-layered structure having a plurality of sub-layers. In some embodiments, the sub-layers of the seed layer 32 may be an amorphous film, a crystalline film, or a combination thereof. Other suitable materials or configurations for the seed layer 32 are within the contemplated scope of the present disclosure. In some embodiments, the seed layer 32 has a thickness ranging from about 50 Å to about 500 Å.

Figure 8:
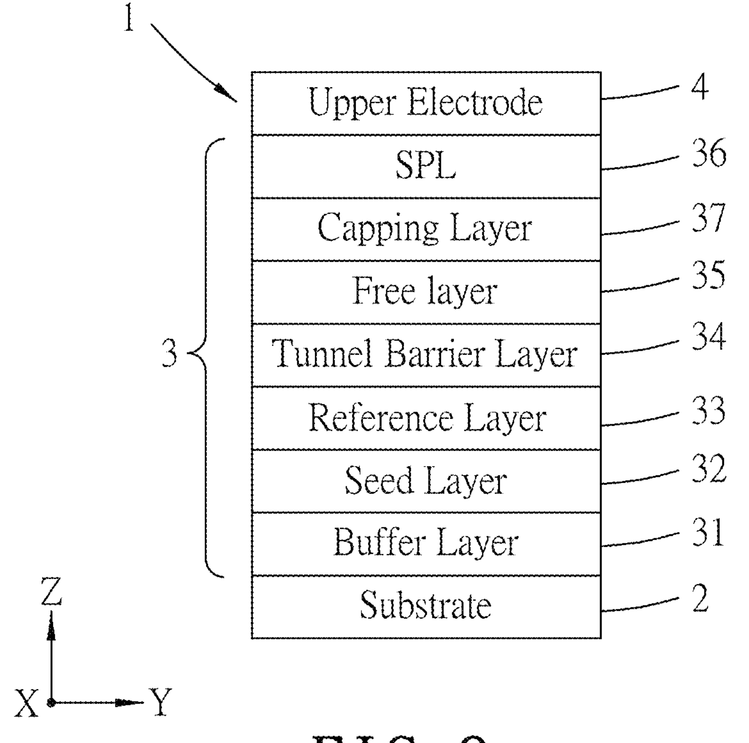
FIG. 8 illustrates a sectional schematic view of another example of the magnetic device in a bottom spin valve configuration in accordance with some embodiments.

FIG. 8 illustrates a sectional schematic view of another example of the magnetic device 1 in a bottom spin valve configuration in accordance with some embodiments. In some embodiments, the MTJ stack 3 further includes a capping layer 37 interposed between the free layer 35 and the SPL 36. The capping layer 37 includes a second insulating material which may the same or different from the first insulating material of the tunnel barrier layer 34. In some embodiments, the second insulating material of the capping layer 37 includes, for example, but is not limited to, magnesium oxide ($MgO_x$), hafnium oxide ($HfO_x$), titanium oxide ($TiO_x$), zirconia oxide ($ZrO_x$), aluminum oxide ($AlO_x$), tantalum oxide ($TaO_x$), tungsten oxide ($WO_x$). The capping layer 37 is optional, but may serve to further increase interfacial PMA effect of the free layer 35 by forming, for example, but not limited to, a magnetic metal/oxide interface. In addition, the capping layer 37 may serve to change the extent of IEC between the free layer 35 and the SPL 36 through adjusting material composition or thickness of the capping layer 37. The thinner the thickness of the capping layer 37, the stronger the IEC between the free layer 35 and the SPL 36, and vice versa. In some embodiments, the capping layer 37 has a thickness ranging from about 1 Å to about 15 Å.

Figure 9:
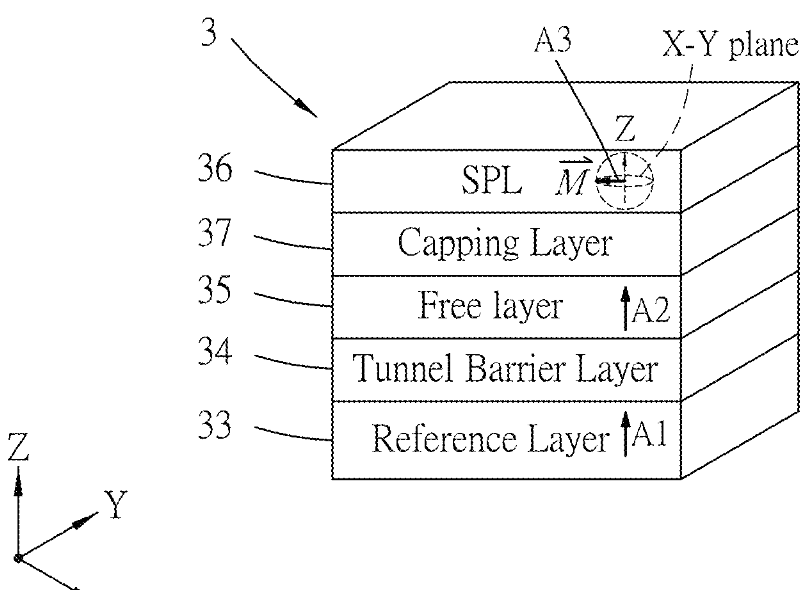
FIG. 9 illustrates a fragmentary enlarged perspective view of an example of the MTJ stack shown in FIG. 8 when an inter-layer exchange coupling (IEC) between the free layer and the SPL is relatively weak in accordance with some embodiments.

FIG. 9 illustrates a fragmentary enlarged perspective view of an example of the MTJ stack 3 shown in FIG. 8 when IEC between the free layer 35 and the SPL 36 is relatively weak in accordance with some embodiments. In FIG. 9, the MTJ stack 3, when viewed from thereabove, is illustrated as a rectangular shape, but is not so limited. In some embodiments, that are not shown in the figures, the MTJ stack 3 may be illustrated as a circular shape or an elliptical shape when viewed from thereabove. In FIG. 9, (i) the magnetization direction of the reference layer 33 and the free layer 35 are represented by arrows (A1, A2), respectively, (ii) the precessional motion of the magnetization vector ($\vec{M}$) (see also FIGS. 2 and 7) of the SPL 36 is shown as a dashed circle, and (iii) the magnetization direction of the magnetization vector ($\vec{M}$) of the SPL 36 at a certain time is represented by an arrow (A3). In some embodiments, the reference layer 33, the tunnel barrier layer 34, the free layer 35, and the SPL 36 are stacked on one another in such order along the Z direction, and are extended laterally along the X and Y directions (i.e., the X-Y plane). The reference layer 33 and the free layer 35 exhibit perpendicular magnetic anisotropy (PMA), and the MTJ stack 3 is shown in a parallel (P) state and in the absence of an external magnetic field. The reference layer 33 has an upward magnetization direction represented by the arrow (A1). In the case shown in FIG. 9, a relatively weak IEC is present between the free layer 35 and the SPL 36. The upward magnetization direction of the free layer 35, which is represented by the arrow (A2), is almost aligned with the Z direction, and the magnetization direction of the SPL 36, which is represented by the arrow (A3), is almost retained within the X-Y plane. Although, in the embodiment shown in FIG. 9, each of the reference layer 33 and the free layer 35 have the upward magnetization direction represented by the arrow (A1 or A2) in the parallel (P) state, in other not shown embodiments, each of the reference layer 33 and the free layer 35 may have a downward magnetization direction in the parallel (P) state. In another not shown embodiments, the MTJ stack 3 may be in the antiparallel (AP) state, the free layer 35 has the downward (or the upward) magnetization direction, and the reference layer 33 has the upward (or the downward) magnetization direction.

Figure 10:
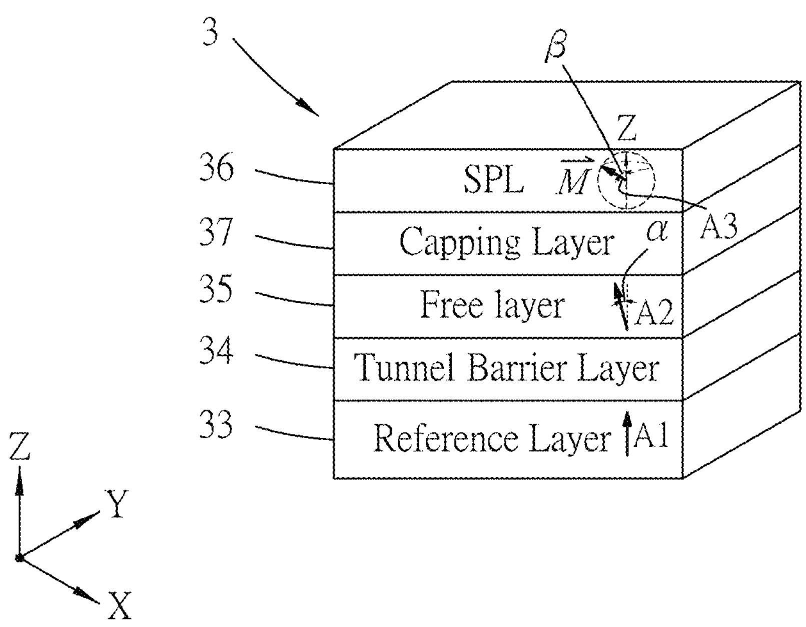
FIG. 10 is a view similar to that of FIG. 9 but illustrating another example of the MTJ stack shown in FIG. 8 when an IEC between the free layer and the SPL is relatively strong in accordance with some embodiments.

FIG. 10 is a view similar to that of FIG. 9 but illustrating another example of the MTJ stack 3 shown in FIG. 8 when an IEC between the free layer 35 and the SPL 36 is relatively strong in accordance with some embodiments. Due to relatively strong IEC between the free layer 35 and the SPL 36, the upward magnetization direction of the free layer 35, which is represented by the arrow (A2), is tilted by an angle ($\alpha$) relative to the Z direction, and the magnetization direction of the SPL 36, which is represented by the arrow (A3), randomly flips (or processes) about the Z direction at an angle ($\theta$). The tilted magnetization direction of the free layer 35 (represented by the angle ($\alpha$)) in the absence of an external magnetic field is conducive to initiate the switching of the free layer 35 from the upward magnetization direction to a downward magnetization direction. As shown FIG. 10, the angle ($\alpha$) is an acute angle. In other not shown embodiments, when the free layer 35 has the upward magnetization direction which is antiparallel to the magnetization direction of the reference layer 33, or when the free layer 35 has the downward magnetization direction which is parallel or antiparallel to the magnetization direction of the reference layer 33, the tilted magnetization direction of the free layer 35 occurs as well with introduction of the SPL 36, thereby facilitating the switching of the free layer 35.

In detail, when an external magnetic field (or a write current) is applied to the MTJ stack 3, a spintronic torque resulting from the external magnetic field (or the write current) will be applied to the MTJ stack 3 for switching the free layer 35 from the upward magnetization direction to the downward magnetization direction. Meanwhile, the magnetization direction of the SPL 36 will be switched to and stabilized in a specific magnetization direction in response to the external magnetic field (or the write current). Since the specific magnetization direction of the SPL 36 is different from the magnetization direction of the free layer 35, the SPL 36 provides an extra spintronic torque to the free layer 35, thereby facilitating switching of the free layer 35, for example, but not limited to, from the upward magnetization direction to the downward magnetization direction. In addition, the SPL 36 has a magnetic susceptibility much larger than that of paramagnets due to super-paramagnetic properties thereof (that is, the SPL 36 may be magnetized using a relatively small magnetic field or a relatively small current), and hence the required write current (or switching current) may be reduced, thereby increasing energy efficiency.

Figure 11:
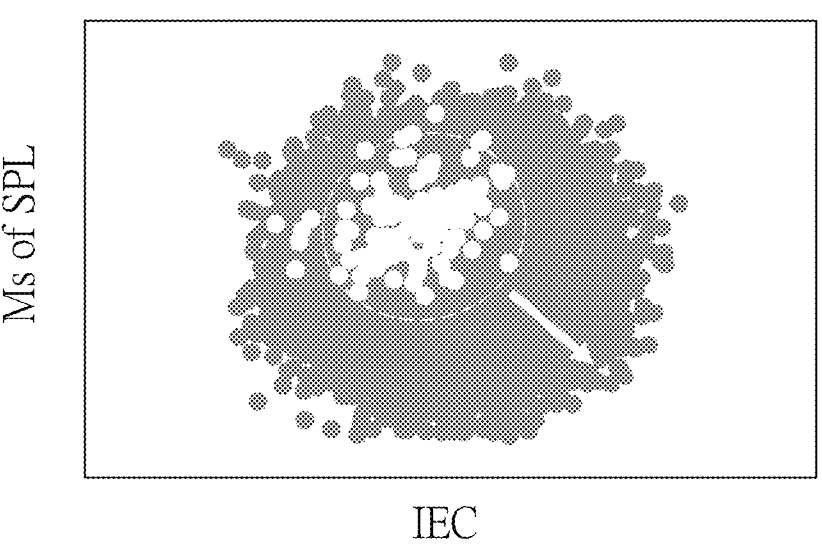
FIG. 11 is a scatter plot of saturation magnetization (Ms) of the SPL versus IEC between the free layer and the SPL for samples of the magnetic device shown in FIG. 8 in accordance with some embodiment s.
Figure 12:
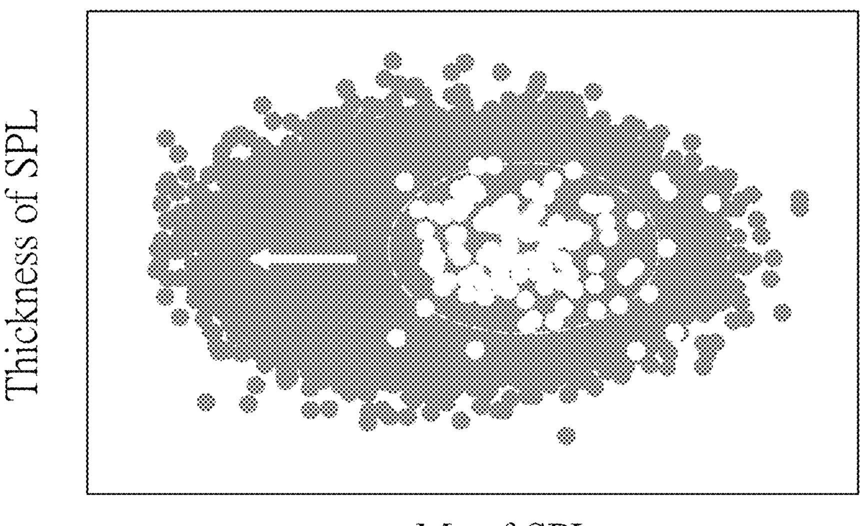
FIG. 12 is a scatter plot of a thickness of the SPL versus saturation magnetization (Ms) of the SPL for the samples of the magnetic device shown in FIG. 8 in accordance with some embodiments.

FIG. 11 is a scatter plot of saturation magnetization (Ms) of the SPL 36 versus an IEC value between the free layer 35 and the SPL 36 for samples of the magnetic device 1 shown in FIG. 8 in accordance with some embodiments. FIG. 12 is a scatter plot of a thickness of the SPL 36 versus saturation magnetization (Ms) of the SPL 36 for the samples of the magnetic device 1 shown in FIG. 8 in accordance with some embodiments. In FIGS. 11 and 12, each of the samples are subjected to electric tests including read and write operations, and the samples which are failed during the electric tests are shown as white spots. It can be concluded that in the magnetic device 1, when the SPL 36 has a higher IEC value to the free layer 35 and/or a lower Ms value, the magnetic device 1 may have a lower failure rate. In some embodiments, the Ms value and the IEC value may be adjusted by the x value in $A_xB_{(1-x)}$ (i.e., the ratio of the non-magnetic material (A) in the alloy).

It is noted that the ratio of the non-magnetic material (A) in the alloy of the SPL 36 not only affects the Ms value and the IEC value, but also affects a Curie temperature of the SPL 36. When the Curie temperature of the SPL 36 is lower than room temperature, the SPL 36 may behave as a paramagnetic material. When the Curie temperature of the SPL 36 is higher than a certain extent, the SPL 36 may tend to behave as a ferromagnetic material and the magnetization vector ($\vec{M}$) thereof cannot flip randomly in the X-Y plane. Therefore, the SPL 36 may exhibit superparamagnetic properties when the SPL 36 has a Curie temperature within a certain temperature range. As such, the ratio of the non-magnetic material (A) in the alloy of the SPL 36 may be adjusted to be within a predetermined range such that the SPL 36 has an acceptable IEC value and exhibits the superparamagnetic properties. In some embodiments, the SPL 36 includes an alloy with a Curie temperature higher than room temperature and not higher than about 1000° C. Other suitable manners for adjusting the IEC value, and the Curie temperature and the Ms value of the SPL 36 are within the contemplated scope of the present disclosure. By tuning the IEC value between the free layer 35 and the SPL 36, and the Curie temperature and the Ms value of the SPL 36, the magnetization direction of the free layer 35, in the absence of an external magnetic field, is tilted relative to the Z direction within a predetermined extent (i.e., the angle ($\alpha$) shown in FIG. 10 is maintained within a predetermined range). In this case, the MTJ stack 3 can be retained in the P state or the AP state when no electromagnetic field or no writing current is applied. In addition, when an electromagnetic field (or a write current) is applied, the MTJ stack 3, which has the free layer 35 with a slightly tilted magnetization direction relative to the Z direction (for example, the MTJ stack 3 shown in FIG. 10), can be easier to switch between the P state (for example, the magnetization directions of the free layer 35 and the reference layer 33 are both in the upward magnetization direction) and the AP state (for example, the free layer 35 is in the downward magnetization direction and the reference layer 33 is in the upward magnetization direction) compared to the MTJ stack 3 which has the free layer 35 without a tilted magnetization direction relative to the Z direction (for example, the MTJ stack 3 shown in FIG. 9).

Figure 13:
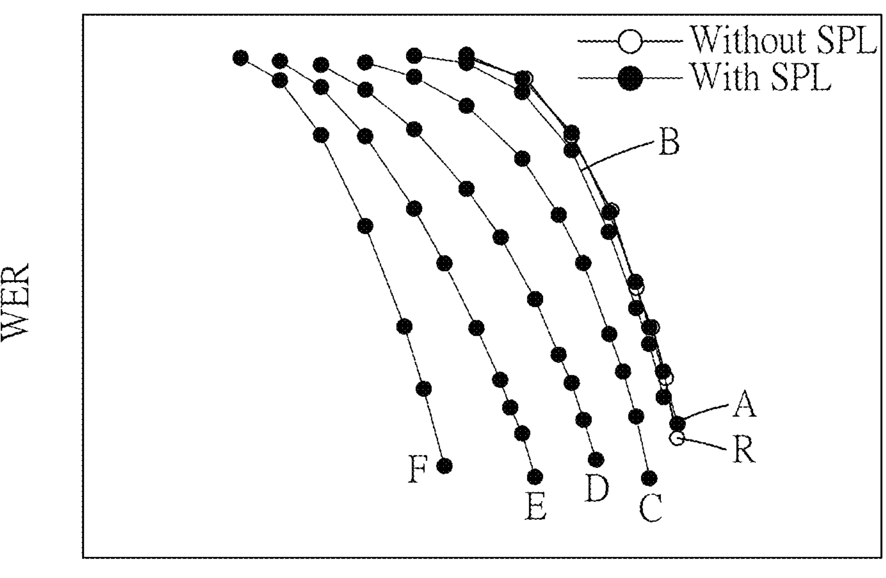
FIG. 13 is a graph illustrating a relationship of a write error rate (WER) of the magnetic device versus an intensity of a first write current pulse $I_{W0}$ for Samples R, and A to F in accordance with some embodiments.
Figure 14:
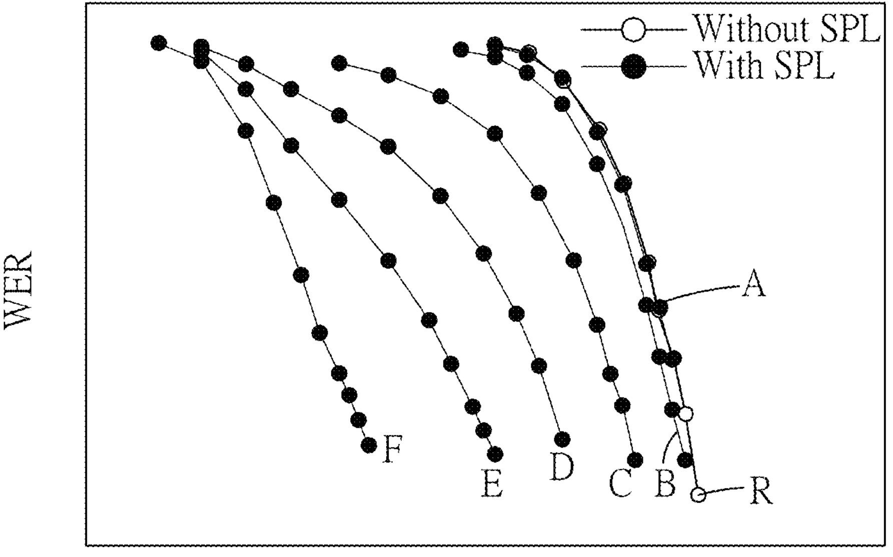
FIG. 14 is a graph illustrating a relationship of a write error rate (WER) of the magnetic device versus an intensity of a second write current pulse $I_{W1}$ for Samples R, and A to F in accordance with some embodiments.

FIG. 13 is a graph illustrating a relationship of a write error rate (WER) of the magnetic device 1 versus an intensity of a first write current pulse $I_{W0}$ for Samples R, and A to F in accordance with some embodiments. FIG. 14 is a graph illustrating a relationship of a write error rate (WER) of the magnetic device 1 versus an intensity of a second write current pulse $I_{W1}$ for Samples R, and A to F in accordance with some embodiments. The write error rate is a probability that a write error occurs during a write operation in which a write current pulse is applied to the magnetic device 1. In FIGS. 13 and 14, the write current pulse is applied to each of the samples with increasing current intensity and with fixed pulse width (i.e., all detected points in each sample are applied with different current intensities), and the values of the WER at the detected points for each sample are calculated using corresponding current intensities, respectively. The first write current pulse $I_{W0}$ and the second write current pulse $I_{W1}$ are respectively used to write a first logic value (e.g., 0) and a second logic value (e.g., 1) to the magnetic device 1. Sample R has a structure which is similar to that of the magnetic device 1 shown in FIG. 8 except that the SPL 36 is absent (i.e., no IEC is presented). Sample A has a structure which is similar to that of the magnetic device 1 shown in FIG. 8 except that the IEC between the SPL 36 and the free layer 35 is about zero. Samples B to F have structures which are similar to that of Sample A but with increasing values of the IEC between the SPL 36 and the free layer 35 (i.e., the IEC value: sampleF>sampleE>sampleD>sampleC>sampleB>sample A). Although it can be seen that for all samples, a lower WER scale can be obtained by increasing an intensity of the first or second write current pulse, it is worth noting that Sample F having a relatively high IEC value can achieve a certain WER scale using a relatively low intensity of the first or second write current pulses. In some not shown embodiments, the write current pulse is applied to each of the samples with increasing pulse width and with fixed current intensity (i.e., all detected points in each sample are applied with different pulse widths), and the values of the WER at the detected points for each sample are calculated using corresponding pulse widths, respectively. Sample F can achieve a certain WER scale using a relatively small pulse width of the first or second write current pulses. Therefore, the magnetic device 1 may achieve an increased write speed and/or energy efficiency through introduction of the SPL 36 in the MTJ stack 3 and increased IEC value between the SPL 36 and the free layer 35.

Figures 15, 16:
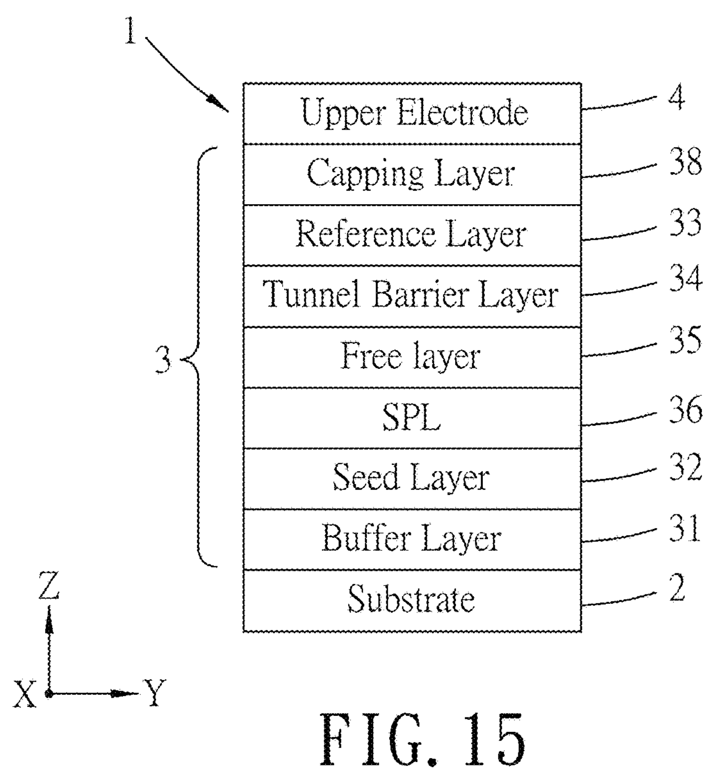
FIG. 15 illustrates a sectional schematic view of an example of the magnetic device in a top spin valve configuration in accordance with some embodiments.
FIG. 16 illustrates a sectional schematic view of another example of the magnetic device in the top spin valve configuration in accordance with some embodiments.

FIG. 15 illustrates a sectional schematic view of an example of the magnetic device 1 in a top spin valve configuration in accordance with some embodiments. The magnetic device 1 shown in FIG. 15 has a structure similar to that of the magnetic device 1 shown in FIG. 1 except that the reference layer 33, the tunnel barrier layer 34, the free layer 35, and the SPL 36 are reversely stacked, and that the magnetic device 1 shown in FIG. 15 further includes an additional capping layer 38 interposed between the reference layer 33 and the upper electrode 4. Suitable material for forming the additional capping layer 38 is similar to the second insulating material of the capping layer 37 as described in FIG. 8, and is provided to increase interfacial PMA effect of the reference layer 33 by forming, for example, but not limited to, a magnetic metal/oxide interface. Similar to the magnetic device 1 shown in FIG. 8, the magnetic device 1 shown in FIG. 15 may include the capping layer 37 interposed between the SPL 36 and the free layer 35.

FIG. 16 illustrates a sectional schematic view of another example of the magnetic device 1 in the top spin valve configuration in accordance with some embodiments. The magnetic device 1 shown in FIG. 16 has a structure similar to that of the magnetic device 1 shown in FIG. 15 but further includes a spacer layer 39 interposed between the seed layer 32 and the SPL 36. The spacer layer 39 is used for lattice matching between the seed layer 32 and a layer (e.g., the SPL 36) disposed thereon, and includes ruthenium (Ru), iridium (Ir), molybdenum (Mo), tungsten (W), titanium (Ti), tantalum (Ta), but is not limited thereto. Similar to the magnetic device 1 shown in FIG. 8, the magnetic device 1 shown in FIG. 16 may include the capping layer 37 interposed between the SPL 36 and the free layer 35.

In some alternative embodiments, the MTJ stack 3 or the magnetic device 1 may further include additional features, and/or some features present in the MTJ stack 3 or the magnetic device 1 may be modified, replaced, or eliminated without departure from the spirit and scope of the present disclosure.

Figure 17:
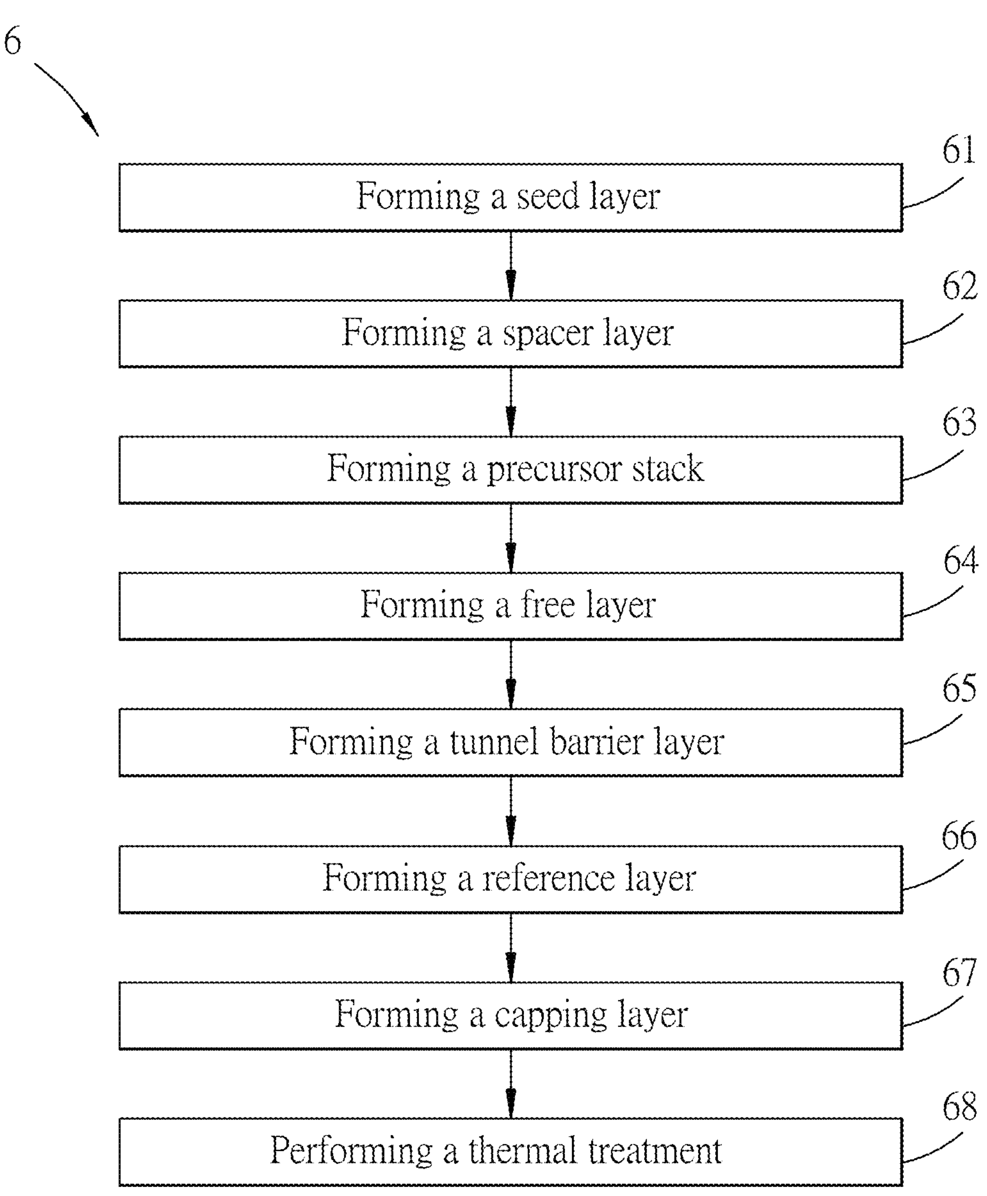
FIG. 17 is a flow diagram illustrating a method for manufacturing a MTJ stack in accordance with some embodiments.
Figure 18:
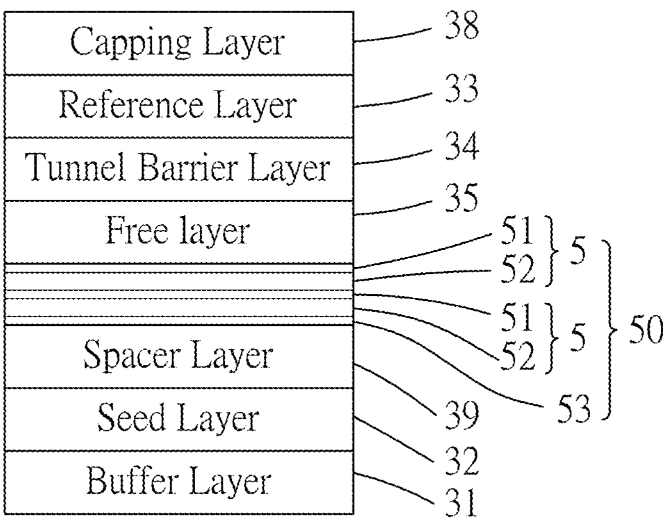
FIGS. 18 and 21-23 are each a schematic view illustrating an intermediate stage of the method depicted in FIG. 17 in accordance with some embodiments.
Figure 18:
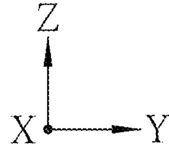

FIG. 17 is a flow diagram illustrating a method 6 for manufacturing a MTJ stack 3 in accordance with some embodiments, for example, the previously mentioned MTJ stack 3 as shown in FIG. 16, but is not thus limited. The method 6 for manufacturing the MTJ stack 3 includes steps 61 to 68. FIG. 18 is a schematic view illustrating an intermediate stage of the method 6 in accordance with some embodiments.

In step 61, as shown in FIGS. 17 and 18, the seed layer 32 is formed on the buffer layer 31 using a deposition process, such as physical vapor deposition (PVD), molecular beam epitaxy (MBE), pulsed laser deposition (PLD), and electron beam physical vapor deposition (EBPVD). Other suitable techniques for forming the seed layer 32 are within the contemplated scope of the present disclosure. Details regarding the seed layer 32 and the buffer layer 31 are similar to those as described above, and thus details thereof are omitted for the sake of brevity.

In step 62, as shown in FIGS. 17 and 18, the spacer layer 39 is formed on the seed layer 32 using, for example, a deposition process similar to those mentioned in step 61. Other suitable techniques for forming the spacer layer 39 are within the contemplated scope of the present disclosure. Details regarding the spacer layer 39 are similar to those as described above, and thus details thereof are omitted for the sake of brevity.

In step 63, as shown in FIGS. 17 and 18, a precursor stack 50 for forming the SPL 36 is formed on the spacer layer 39. In some embodiments, the precursor stack 50 includes at least one repeating unit 5 (which includes a non-magnetic layer 51 and a magnetic layer 52) and an additional non-magnetic layer 53, and may be formed using, for example, a deposition process similar to those mentioned in step 61. In the at least one repeating unit 5 or in each of the repeating units 5, the non-magnetic layer 51 is disposed between the magnetic layer 52 and the free layer 35 formed thereafter. The additional non-magnetic layer 53 is formed on the at least one repeating unit 5 opposite to the free layer 35 formed thereafter. Although in the embodiment shown in FIG. 18, the precursor layer 50 includes two of the repeating units 5 and the additional non-magnetic layer 53 for forming the SPL 36, the number of the repeating units 5 may be varied to tune the IEC value between the SPL 36 and the free layer 35 formed thereafter. Each of the non-magnetic layer 51 and the additional non-magnetic layer 53 includes a non-magnetic element which is in a solid form at room temperature, and includes a non-magnetic material, for example, tungsten (W), silicon (Si), tantalum (Ta), titanium (Ti), molybdenum (Mo), ruthenium (Ru), iridium (Ir), aluminum (Al), copper (Cu), platinum (Pt), zirconium (Zr), zinc (Zn), lead (Pb), or combinations thereof. The materials for the non-magnetic layer(s) 51 of the repeating unit(s) 5 and the additional non-magnetic layer 53 may be the same or different from each other. The magnetic layer 52 includes cobalt (Co), iron (Fe), nickel (Ni), or alloys thereof. The thicknesses for the non-magnetic layer(s) 51, the magnetic layer(s) 52, and the additional non-magnetic layer 53 may be the same or different from each other. The sub-layers of the SPL 36 may be formed by adjusting the materials and/or thickness for each layers in the precursor stack 50. Other suitable techniques and materials for forming the precursor stack 50 are within the contemplated scope of the present disclosure.

In some embodiments, a total volume percentage of the non-magnetic layer(s) 51 of the repeating unit(s) 5 and the additional non-magnetic layer 53 ranges from about 25% to about 45% based on a total volume of the precursor stack 50 so that the SPL 36 to be subsequently formed may have a desired Curie temperature and a desired Ms value, and so that a desired IEC is presented between the SPL 36 and the free layer 35 formed thereafter. In some embodiments, the ratio of the non-magnetic material in the alloy of the SPL 36 may be tuned by a total volume percentage of the non-magnetic layer(s) 51 of the repeating unit(s) 5 and the additional non-magnetic layer 53 (i.e., a volume percentage of the non-magnetic layers) based on a total volume of the precursor stack 50.

Figure 19:
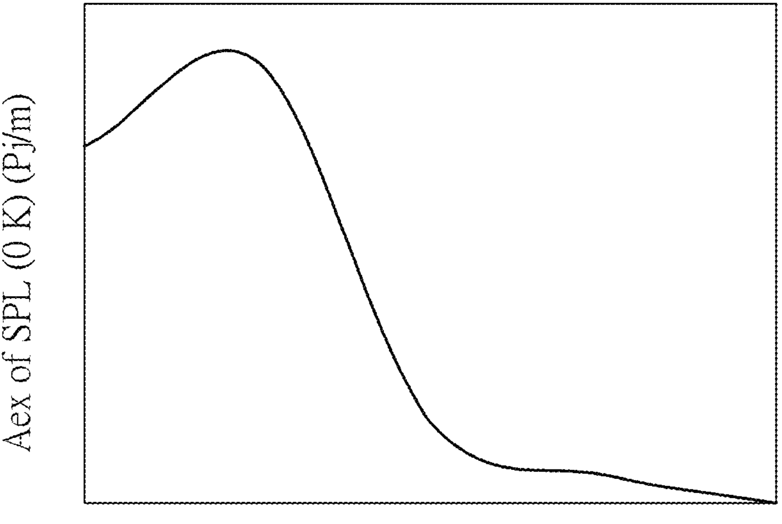
FIG. 19 is a graph illustrating a relationship of an exchange stiffness coefficient (Aex) of the SPL versus a voltage percentage of non-magnetic layers in a precursor stack in accordance with some embodiments.
Figure 20:
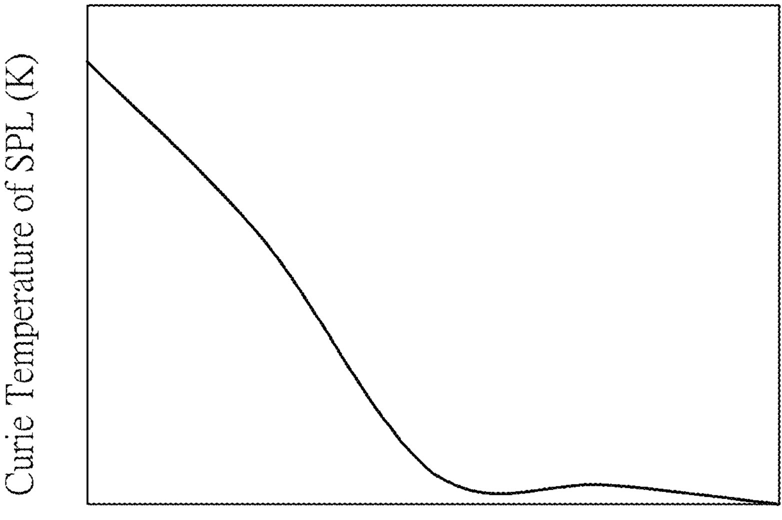
FIG. 20 is a graph illustrating a relationship of a Curie temperature of the SPL versus a voltage percentage of non-magnetic layers in a precursor stack in accordance with some embodiments.

FIG. 19 is a graph illustrating a relationship of an exchange stiffness coefficient (Aex) of the SPL 36 formed thereafter versus a volume percentage of the non-magnetic layers 51, 53 in the precursor stack 50 in accordance with some embodiments. FIG. 20 is a graph illustrating a relationship of a Curie temperature of the SPL 36 versus a volume percentage of the non-magnetic layers 51, 53 in the precursor stack 50 in accordance with some embodiments. Exchange stiffness coefficient (Aex) of the SPL 36 represents strength of direct exchange interaction among atoms in the alloy of SPL 36. It is believed that a value of the exchange stiffness coefficient (Aex) of the SPL 36 is proportional to that of IEC value between the SPL 36 and the free layer 35. Therefore, it can be concluded from FIGS. 19 and 20 that when the volume percentage of the non-magnetic layers 51, 53 decreases, a value of IEC between the SPL 36 and the free layer 35 would increase to an extent and then slightly decrease. Furthermore, it can be seen that a value of the Curie temperature of the SPL 36 continuously increases with decreasing of the volume percentage of the non-magnetic layers 51, 53. In some embodiments, to ensure that the SPL 36 has an acceptable IEC value and exhibits the superparamagnetic properties, the volume percentage of the non-magnetic layers 51, 53 may ranges from about 25% to about 45% based on a total volume of the precursor stack 50.

In step 64, as shown in FIGS. 17 and 18, the free layer 35 is formed on the precursor stack 50 using, for example, a deposition process similar to those mentioned in step 61. Other suitable techniques for forming the free layer 35 are within the contemplated scope of the present disclosure. Details regarding the free layer 35 are similar to those as described above, and thus details thereof are omitted for the sake of brevity.

In step 65, as shown in FIGS. 17 and 18, the tunnel barrier layer 34 is formed on the free layer 35 using, for example, a deposition process similar to those mentioned in step 61. Other suitable techniques for forming the tunnel barrier layer 34 are within the contemplated scope of the present disclosure. Details regarding the tunnel barrier layer 34 are similar to those as described above, and thus details thereof are omitted for the sake of brevity.

In step 66, as shown in FIGS. 17 and 18, the reference layer 33 is formed on the tunnel barrier layer 34 using, for example, a deposition process similar to those mentioned in step 61. Other suitable techniques for forming the reference layer 33 are within the contemplated scope of the present disclosure. Details regarding the reference layer 33 are similar to those as described above, and thus details thereof are omitted for the sake of brevity.

In step 67, as shown in FIGS. 17 and 18, the additional capping layer 38 is formed on the reference layer 33 using, for example, a deposition process similar to those mentioned in step 61. Other suitable techniques for forming the additional capping layer 38 are within the contemplated scope of the present disclosure. Details regarding the additional capping layer 38 are similar to those as described above, and thus details thereof are omitted for the sake of brevity.

In step 68, as shown in FIGS. 16 and 17, a thermal treatment is performed such that the at least one repeating unit 5 and the uppermost non-magnetic layer 53 are inter-diffused with each other so as to form an alloy which serves as the SPL 36. In some embodiments, the thermal treatment is an annealing process performed at a temperature ranging from about 200° C. to about 600° C. Details regarding the SPL 36 are similar to those as described above, and thus details thereof are omitted for the sake of brevity. Other suitable techniques for forming the SPL 36 are within the contemplated scope of the present disclosure.

Figure 21:
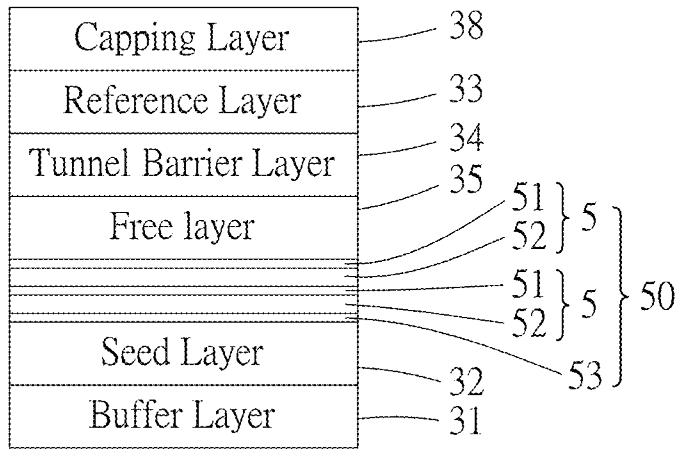
Figure 21:
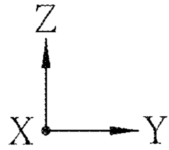
Figure 22:
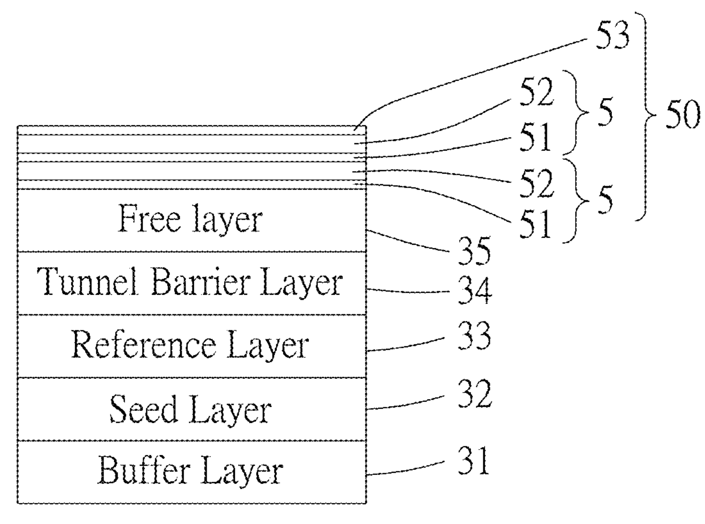
Figure 22:
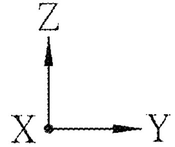
Figure 23:
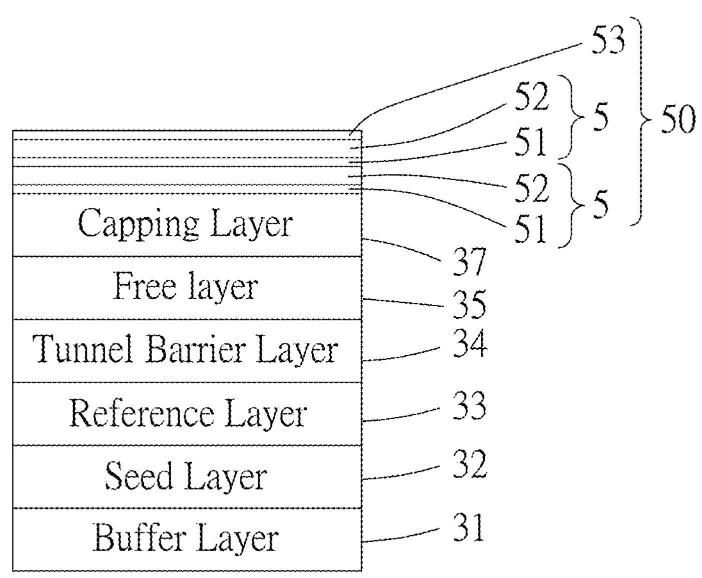
Figure 23:
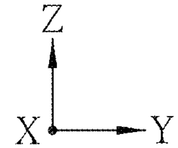

In some embodiments, some steps in the method 6 may be modified, replaced, or eliminated without departure from the spirit and scope of the present disclosure. For example, when step 62 is omitted and the precursor stack 50 is formed on the seed layer 32 in step 63 (see FIG. 21), the MTJ stack 3 shown in FIG. 15 can be obtained. When the sequence of steps is adjusted (i.e., before step 68, steps 66, 65, 64, and 63 are sequentially performed, see FIG. 22), the MTJ stack 3 shown in FIG. 1 can be obtained by omitting steps 62 and 67, and forming the reference layer 33 on the seed layer 32 in step 66. In a method for forming the MTJ stack 3 shown in FIG. 1, after forming the free layer 35 in step 64 and before forming the precursor stack 50 in step 63, a step of forming the capping layer 37 on the free layer 35 may be further included to permit the capping layer 37 to be interposed between the free layer 35 and the precursor stack 50 after step 63 (see FIG. 23), thereby obtaining the MTJ stack 3 shown in FIG. 8. In some alternative embodiments, other suitable methods may also be applied for forming the MTJ stack 3.

In this disclosure, a MTJ stack is provided with a superparamagnetic layer (SPL) for improving energy efficiency of MRAM products owing to reduced write current (switching current) and/or reduced switching latency. The SPL which is disposed on a free layer opposite to a tunnel barrier layer is considered to assist switching or flipping of the free layer, because the SPL has an easy-plane magnetic anisotropy, and has a magnetization direction different from that of the free layer. Hence, when writing a data in the MTJ stack with the SPL, a relatively low write current can be used to achieve a reduced write error rate (WER) at a relatively fast write speed. Furthermore, the free layer coupled to the SPL may have an increasing magnetic moment, thereby improving data retention performance of memories. Therefore, MRAM products including the MTJ stack of the present disclosure may have a higher potential to be used in high-throughput memory applications.

In accordance with some embodiments of the present disclosure, a magnetic tunnel junction (MTJ) stack includes a reference layer, a tunnel barrier layer disposed on the reference layer, a free layer disposed on the tunnel barrier layer opposite to the reference layer, and a superparamagnetic layer disposed on the free layer opposite to the tunnel barrier layer. The reference layer has a fixed magnetization direction. The tunnel barrier layer includes a first insulating material. The free layer has a changeable magnetization direction.

In accordance with some embodiments of the present disclosure, the superparamagnetic layer has an easy-plane magnetic anisotropy. The free layer has an interfacial perpendicular magnetic anisotropy.

In accordance with some embodiments of the present disclosure, the superparamagnetic layer has a magnetization direction different from that of the free layer.

In accordance with some embodiments of the present disclosure, the superparamagnetic layer includes an alloy with a body-centered cubic (bcc) crystalline structure.

In accordance with some embodiments of the present disclosure, the superparamagnetic layer includes an alloy of a magnetic material and a non-magnetic material.

In accordance with some embodiments of the present disclosure, the non-magnetic material includes tungsten (W), silicon (Si), tantalum (Ta), titanium (Ti), molybdenum (Mo), ruthenium (Ru), iridium (Ir), aluminum (Al), copper (Cu), platinum (Pt), zirconium (Zr), zinc (Zn), lead (Pb), or combinations thereof.

In accordance with some embodiments of the present disclosure, the superparamagnetic layer includes an alloy with a Curie temperature higher than room temperature and not higher than 1000° C.

In accordance with some embodiments of the present disclosure, the superparamagnetic layer has a thickness ranging from 2 Å to 15 Å.

In accordance with some embodiments of the present disclosure, the MTJ stack of claim 1 further includes a capping layer interposed between the free layer and the superparamagnetic layer. The capping layer includes a second insulating material.

In accordance with some embodiments of the present disclosure, each of the first and second insulating materials independently includes an oxide, a nitride, an oxynitride, or combinations thereof.

In accordance with some embodiments of the present disclosure, a method for manufacturing a MTJ stack includes forming a reference layer with a fixed magnetization direction; forming a tunnel barrier layer on the reference layer, and including an insulating material; forming a free layer on the tunnel barrier layer opposite to the reference layer, and having a changeable magnetization direction, and forming a superparamagnetic layer on the free layer opposite to the tunnel barrier layer.

In accordance with some embodiments of the present disclosure, forming the superparamagnetic layer includes: forming a precursor stack which includes at least one repeating unit which includes a non-magnetic layer and a magnetic layer, the non-magnetic layer being disposed between the magnetic layer and the free layer, and an additional non-magnetic layer on the at least one repeating unit opposite to the free layer; and performing a thermal treatment such that the at least one repeating unit and the additional non-magnetic layer are inter-diffused with each other to form an alloy which serves as the superparamagnetic layer.

In accordance with some embodiments of the present disclosure, a total volume percentage of the non-magnetic layer of the at least one repeating unit and the additional non-magnetic layer ranges from 25% to 45% based on a total volume of the precursor stack.

In accordance with some embodiments of the present disclosure, each of the non-magnetic layer and the additional non-magnetic layer includes tungsten (W), silicon (Si), tantalum (Ta), titanium (Ti), molybdenum (Mo), ruthenium (Ru), iridium (Ir), aluminum (Al), copper (Cu), platinum (Pt), zirconium (Zr), zinc (Zn), lead (Pb), or combinations thereof.

In accordance with some embodiments of the present disclosure, the superparamagnetic layer has an easy-plane magnetic anisotropy, and has a magnetization direction different from that of the free layer. The free layer has an interfacial perpendicular magnetic anisotropy.

In accordance with some embodiments of the present disclosure, a method for manufacturing a MTJ stack includes: forming a reference layer with a fixed magnetization direction; forming a tunnel barrier layer on the reference layer, and including a first insulating material; forming a free layer on the tunnel barrier layer opposite to the reference layer, and having a changeable magnetization direction; forming a precursor stack which includes at least one repeating unit which includes a non-magnetic layer and a magnetic layer, the non-magnetic layer being disposed between the magnetic layer and the free layer, and an additional non-magnetic layer on the at least one repeating unit opposite to the free layer; and performing a thermal treatment such that the at least one repeating unit and the additional non-magnetic layer are inter-diffused with each other so as to form a superparamagnetic layer.

In accordance with some embodiments of the present disclosure, each of the non-magnetic layer and the additional non-magnetic layer includes tungsten (W), silicon (Si), tantalum (Ta), titanium (Ti), molybdenum (Mo), ruthenium (Ru), iridium (Ir), aluminum (Al), copper (Cu), platinum (Pt), zirconium (Zr), zinc (Zn), lead (Pb), or combinations thereof In accordance with some embodiments of the present disclosure, the superparamagnetic layer has an easy-plane magnetic anisotropy, and has a magnetization direction different from that of the free layer. The free layer has an interfacial perpendicular magnetic anisotropy.

In accordance with some embodiments of the present disclosure, the method further includes, before performing the thermal treatment: forming a capping layer between the free layer and the precursor stack. The capping layer includes a second insulating material.

In accordance with some embodiments of the present disclosure, each of the first and second insulating materials independently includes an oxide, a nitride, an oxynitride, or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a MTJ stack, comprising:
forming a stacking portion which includes
a reference layer with a fixed magnetization direction,
a tunnel barrier layer formed on the reference layer, the tunnel barrier layer including an insulating material,
a free layer formed on the tunnel barrier layer opposite to the reference layer, the free layer having a changeable magnetization direction, and
a precursor stack formed on the free layer, the precursor stack including
at least one repeating unit which includes a non-magnetic layer and a magnetic layer, the non-magnetic layer being disposed between the magnetic layer and the free layer, and
an additional non-magnetic layer formed on the at least one repeating unit opposite to the free layer; and
after forming the stacking portion, performing a thermal treatment such that the at least one repeating unit and the additional non-magnetic layer are inter-diffused with each other so as to form a superparamagnetic layer on the free layer,
wherein a material of the superparamagnetic layer is represented by $A_xB_{(1-x)}$, where
A is tungsten (W), silicon (Si), titanium (Ti), aluminum (Al), zirconium (Zr), zinc (Zn), lead (Pb), or combinations thereof,
B is cobalt (Co), iron (Fe), nickel (Ni), or alloys thereof, and
x is larger than zero and less than 1.

2. The method of claim 1, wherein the superparamagnetic layer has an easy-plane magnetic anisotropy, the free layer having an interfacial perpendicular magnetic anisotropy.

3. The method of claim 1, wherein the superparamagnetic layer includes an alloy with a body-centered cubic (bcc) crystalline structure.

4. The method of claim 1, wherein the superparamagnetic layer includes an alloy with a Curie temperature higher than room temperature and not higher than 1000° C.

5. The method of claim 1, wherein the superparamagnetic layer has a thickness ranging from 2 Å to 15 Å.

6. A method for manufacturing a MTJ stack, comprising:
forming a reference layer with a fixed magnetization direction;
forming a tunnel barrier layer on the reference layer, the tunnel barrier layer including a first insulating material;
forming a free layer on the tunnel barrier layer opposite to the reference layer, the free layer having a changeable magnetization direction;
forming a precursor stack which includes
at least one repeating unit which includes a non-magnetic layer and a magnetic layer, the non-magnetic layer being disposed between the magnetic layer and the free layer, and
an additional non-magnetic layer on the at least one repeating unit opposite to the free layer; and
performing a thermal treatment such that the at least one repeating unit and the additional non-magnetic layer are inter-diffused with each other so as to form a superparamagnetic layer,
wherein the superparamagnetic layer includes sub-layers each of which has a material represented by $A_xB_{(1-x)}$, where
A is tungsten (W), silicon (Si), titanium (Ti), aluminum (Al), zirconium (Zr), zinc (Zn), lead (Pb), or combinations thereof,
B is cobalt (Co), iron (Fe), nickel (Ni), or alloys thereof, and
x is larger than zero and less than 1, and
wherein x in one of the sub-layers is different from x in another one of the sub-layers.

7. The method of claim 6, wherein the superparamagnetic layer has an easy-plane magnetic anisotropy, and has a magnetization direction different from that of the free layer, the free layer having an interfacial perpendicular magnetic anisotropy.

8. The method of claim 6, further comprising, before performing the thermal treatment:

forming a capping layer between the free layer and the precursor stack, the capping layer including a second insulating material.

9. The method of claim 8, wherein the first insulating material includes an oxide, a nitride, an oxynitride, or combinations thereof, and the second insulating material includes an oxide, a nitride, an oxynitride, or combinations thereof.

10. The method of claim 6, wherein a total volume percentage of the non-magnetic layer of the at least one repeating unit and the additional non-magnetic layer ranges from 25% to 45% based on a total volume of the precursor stack.

11. The method of claim 6, wherein the thermal treatment is performed at a temperature ranging from 200° C. to about 600° C., such that atoms in the at least one repeating unit and the additional non-magnetic layer are inter-diffused with each other so as to form an alloy which serves as the superparamagnetic layer.

12. A method for manufacturing a MTJ stack, comprising:

forming a reference layer with a fixed magnetization direction;

forming a tunnel barrier layer on the reference layer, the tunnel barrier layer including a first insulating material;

forming a free layer on the tunnel barrier layer opposite to the reference layer, the free layer having a changeable magnetization direction;

forming a capping layer on the free layer opposite to the tunnel barrier layer, the capping layer including hafnium oxide, zirconia oxide, tantalum oxide, or tungsten oxide; and forming a precursor stack on the capping layer opposite to the free layer, the precursor stack including at least one repeating unit which includes a non-magnetic layer and a magnetic layer, the non-magnetic layer being disposed between the magnetic layer and the free layer, and an additional non-magnetic layer formed on the at least one repeating unit opposite to the free layer;

performing a thermal treatment such that the at least one repeating unit and the additional non-magnetic layer are inter-diffused with each other so as to form a superparamagnetic layer on the free layer opposite to the tunnel barrier layer, the superparamagnetic layer having a magnetization direction different from that of the free layer, the capping layer being disposed between and interfacing the free layer and the superparamagnetic layer.

13. The method of claim 12, wherein the superparamagnetic layer has an easy-plane magnetic anisotropy and is coupled to the free layer such that an angle between a magnetization direction of the superparamagnetic layer and a magnetization direction of the free layer is less than 90°, and the capping layer includes tungsten oxide.

14. The method of claim 12, wherein the reference layer includes a magnetic material layer including a material selected from cobalt, iron, nickel, cobalt-iron alloy, cobalt-iron-nickel alloy, cobalt-boron alloy, or iron-boron alloy.

15. The method of claim 12, wherein the reference layer further includes a non-magnetic coupling layer.

16. The method of claim 15, wherein the non-magnetic coupling layer includes a material selected from ruthenium or iridium.

17. The method of claim 12, further comprising forming a buffer layer on a substrate so that the buffer layer is disposed between the substrate and the reference layer.

18. The method of claim 17, wherein the buffer layer includes titanium, tantalum, aluminum, titanium nitride, tantalum nitride, zirconium, zirconium nitride, hafnium, hafnium nitride, or combinations thereof.

19. The method of claim 17, further comprising forming a seed layer between the buffer layer and the reference layer.

20. The method of claim 19, wherein the seed layer includes nickel, ruthenium, platinum, tantalum, chromium, nitrides thereof, alloys thereof, or combinations thereof.

* * * * *